US007569453B2

(12) United States Patent
Fishburn

(10) Patent No.: US 7,569,453 B2
(45) Date of Patent: Aug. 4, 2009

(54) CONTACT STRUCTURE

(75) Inventor: Fred Fishburn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 257 days.

(21) Appl. No.: 11/214,531

(22) Filed: Aug. 29, 2005

(65) Prior Publication Data

US 2005/0287794 A1 Dec. 29, 2005

Related U.S. Application Data

(62) Division of application No. 10/753,041, filed on Jan. 7, 2004, now Pat. No. 7,071,055, which is a division of application No. 09/653,640, filed on Aug. 31, 2000, now Pat. No. 6,787,833.

(51) Int. Cl.
*H01L 21/336* (2006.01)

(52) U.S. Cl. .................. 438/257; 438/396; 438/639; 438/672; 257/300; 257/306; 257/516; 257/E21.649

(58) Field of Classification Search ................. 438/253, 438/396, 639, 672, 675, 257; 257/E21.649, 257/300, 306, 379, 516, 370, 767
See application file for complete search history.

(56) References Cited

U.S. PATENT DOCUMENTS

| 3,614,753 | A | * | 10/1971 | Wahlstrom | .................. 365/149 |
| 5,413,961 | A | | 5/1995 | Kim | |
| 5,422,300 | A | * | 6/1995 | Pfiester et al. | .............. 438/439 |
| 5,773,314 | A | | 6/1998 | Jiang et al. | |
| 5,869,901 | A | | 2/1999 | Kusuyama | |
| 5,939,746 | A | | 8/1999 | Koyama et al. | |
| 6,093,615 | A | | 7/2000 | Schuele et al. | |
| 6,100,195 | A | * | 8/2000 | Chan et al. | .................. 438/687 |
| 6,107,136 | A | * | 8/2000 | Melnick et al. | .............. 438/253 |
| 6,140,173 | A | * | 10/2000 | Wolters et al. | .............. 438/240 |
| 6,159,839 | A | | 12/2000 | Jeng et al. | |
| 6,211,035 | B1 | | 4/2001 | Moise et al. | |
| 6,259,126 | B1 | * | 7/2001 | Hsu et al. | .................. 257/298 |
| 6,271,131 | B1 | | 8/2001 | Uhlenbrock et al. | |
| 6,337,238 | B1 | * | 1/2002 | Nakabayashi | .............. 438/240 |
| 6,348,709 | B1 | | 2/2002 | Graettinger et al. | |
| 6,407,422 | B1 | * | 6/2002 | Asano et al. | .............. 257/306 |
| 6,410,397 | B1 | | 6/2002 | Ochiai et al. | |
| 6,417,101 | B2 | | 7/2002 | Hong | |
| 6,433,430 | B2 | | 8/2002 | Sharan et al. | |
| 6,445,023 | B1 | | 9/2002 | Vaartstra et al. | |
| 6,589,867 | B2 | | 7/2003 | Schuele et al. | |

(Continued)

*Primary Examiner*—Hsien-ming Lee
(74) *Attorney, Agent, or Firm*—Schwegman, Lundberg & Woessner, P.A.

(57) ABSTRACT

This invention relates to contact structures for use in integrated circuits and methods of fabricating contact structures. In one embodiment, a contact structure includes a conductive layer, one or more barrier layers formed above the conductive layer, and a barrier structure encircling the polysilicon layer and the one or more barrier layers. In an alternate embodiment, a contact structure is fabricated by forming a polysilicon layer on a substrate, forming a tungsten nitride layer above the polysilicon layer, and etching the polysilicon layer and the tungsten nitride layer to a level below the surface of a substrate structure. A silicon nitride layer is formed above the tungsten nitride layer, and a ruthenium silicide layer is formed above the silicon nitride layer. The ruthenium silicide layer is then polished.

14 Claims, 14 Drawing Sheets

U.S. PATENT DOCUMENTS

| | | |
|---|---|---|
| 6,731,007 B1 | 5/2004 | Saito et al. |
| 7,071,055 B2 | 7/2006 | Fishburn |
| 2001/0045591 A1 | 11/2001 | Tsunemine et al. |
| 2001/0053576 A1 | 12/2001 | DeBoer et al. |
| 2002/0008265 A1 | 1/2002 | Beitel et al. |
| 2002/0011615 A1 | 1/2002 | Nagata et al. |
| 2002/0011618 A1 | 1/2002 | Ishibashi et al. |
| 2002/0022334 A1 | 2/2002 | Yang et al. |
| 2002/0025665 A1 | 2/2002 | Juengling |
| 2002/0052126 A1 | 5/2002 | Lee et al. |
| 2002/0056864 A1 | 5/2002 | Agarwal |
| 2002/0072223 A1 | 6/2002 | Gilbert et al. |
| 2002/0098628 A1 | 7/2002 | Hamada et al. |
| 2006/0220087 A1 | 10/2006 | Fishburn |

\* cited by examiner

CONTACT STRUCTURE

RELATED APPLICATIONS

This application is a Divisional of U.S. application Ser. No. 10/753,041 filed Jan. 7, 2004 and issued Jul. 4, 2006 as U.S. Pat. No. 7,071,055, which is a Divisional of U.S. application Ser. No. 09/653,640 filed Aug. 31, 2000, and issued Sep. 7, 2004 as U.S. Pat. No. 6,787,833, which applications are incorporated herein by reference.

FIELD OF THE INVENTION

This invention relates to contact structures, and more particularly to contact structures used in the fabrication of integrated circuits.

BACKGROUND OF THE INVENTION

An integrated circuit, such as a dynamic random access memory (DRAM) includes passive devices, such as capacitors, and active devices, such as metal-oxide semiconductor field-effect transistors (MOSFETS), fabricated on a single substrate. In fabricating an integrated circuit to perform a particular function, the passive and active devices are coupled together. For example, a capacitor electrode is electrically coupled to a MOSFET drain or source to form a dynamic random access memory (DRAM) cell for storing information.

One method of coupling a capacitor electrode to a MOSFET drain or source includes the operation of directly coupling the capacitor electrode to the drain or source by fabricating the capacitor electrode at the drain or source. Unfortunately, several problems arise when a non-silicon electrode is directly coupled to a MOSFET drain or source. First, the electrode can experience oxidation, which interferes with the electrode conductivity and may cause unpredictable memory cell operation. Electrode oxidation is most likely to occur during capacitor formation processes performed in an $O_2$ atmosphere. Second, atomic migration to and from a substrate, such as silicon substrate, may occur between the substrate in which the MOSFET source and drain are formed and other integrated circuit elements, such as the dielectric layer of a capacitor. Atomic migration alters the electrical properties of the integrated circuit elements and may cause unpredictable memory cell operation.

One solution to these problems is to form a contact structure having a barrier layer located between the electrode and the source or drain for blocking oxygen migration and atomic migration to and from the substrate. Unfortunately, a single barrier layer that effectively blocks both oxygen migration and atomic migration from the substrate may react with the conductive layer fabricated at the source or drain and cause unpredictable circuit operation.

For these and other reasons, there is a need for the present invention.

SUMMARY OF THE INVENTION

The above mentioned problems with coupling devices in integrated circuits and other problems are addressed by the present invention and will be understood by reading and studying the following specification. A contact structure is described that includes one or more layers and other structures for blocking atomic migration in an integrated circuit, which improves the reliability of the circuit.

The present invention provides, in one embodiment, a contact including a polysilicon layer formed on a substrate, one or more barrier layers formed above the polysilicon layer, and a barrier structure encircling the polysilicon layer and the one or more barrier layers. The polysilicon layer provides a conductive material for coupling to an active or a passive device in an integrated circuit. At least one of the one or more barrier layers restricts the migration of atoms to and from the substrate, and at least one of the one or more barrier layers restricts the migration of oxygen atoms. Restricting the migration of substrate atoms, prevents the electrical properties of the integrated circuit devices from being inadvertently altered during circuit fabrication. Restricting the migration of oxygen atoms, deters oxidation at electrode surfaces, such as capacitor electrode surfaces. Since the barrier layers of the contact are also electrically conductive, the contact is suitable for use in interconnecting integrated circuit devices.

In an alternate embodiment, the present invention provides a method of fabricating a contact. The method includes forming a polysilicon layer and a tungsten nitride layer above a base integrated circuit structure. The polysilicon layer is formed at an electrical connection site of an integrated circuit device. The polysilicon layer and the tungsten nitride layer are etched to a level below the surface of the base integrated circuit structure. The polysilicon layer encircling the contact is etched much deeper, and a silicon nitride layer is formed to encircle the tungsten nitride layer. A ruthenium silicide layer is formed above the tungsten nitride layer as an oxygen barrier. The silicon nitride layer prevents the polysilicon layer from reacting with the ruthenium silicide layer. After polishing and cleaning, the ruthenium silicide layer is ready for coupling to an integrated circuit device.

DETAILED DESCRIPTION

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
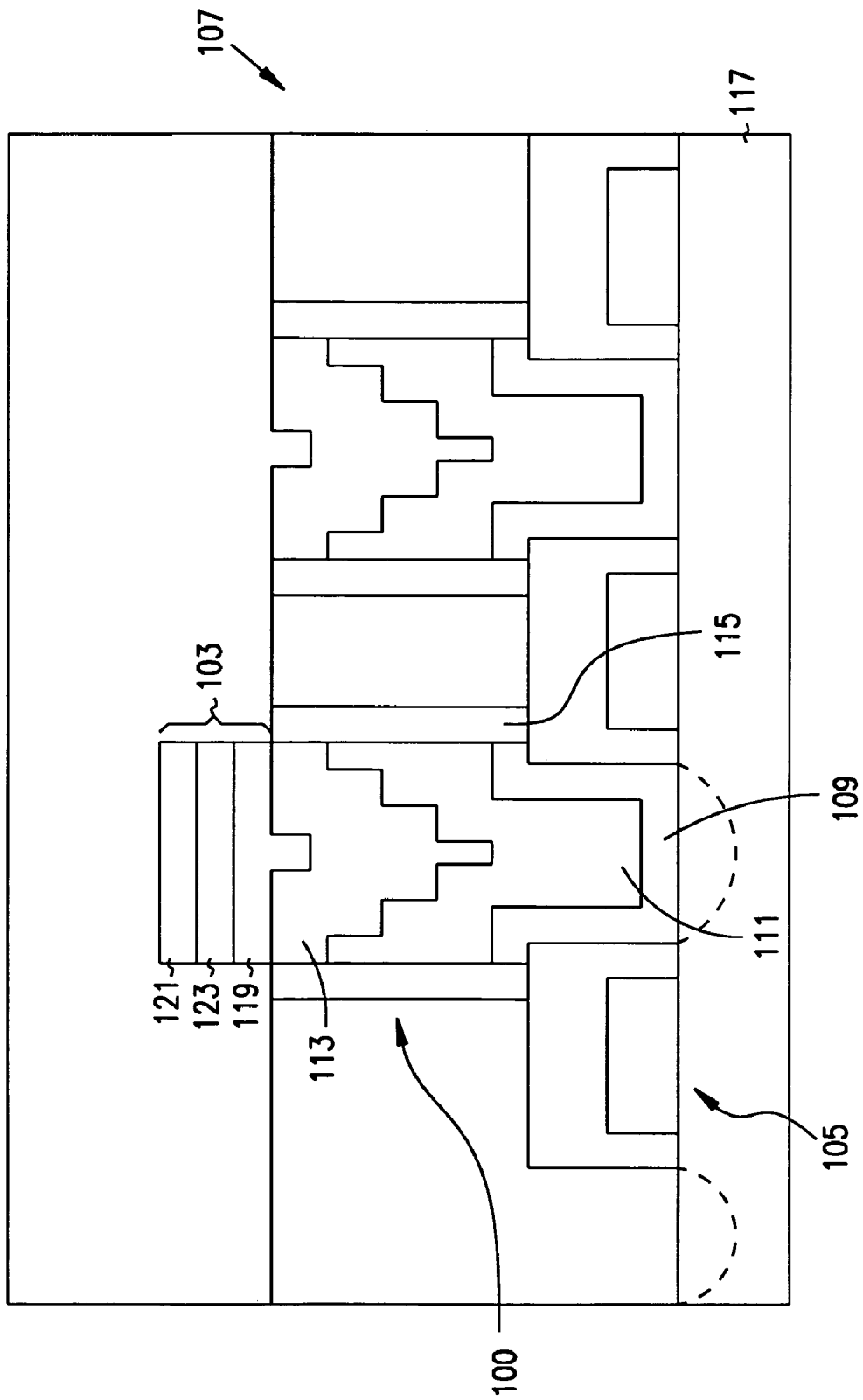
FIGS. 1, 1A are illustrations of a cross-sectional view of embodiments of a contact structure
Figure 1A:
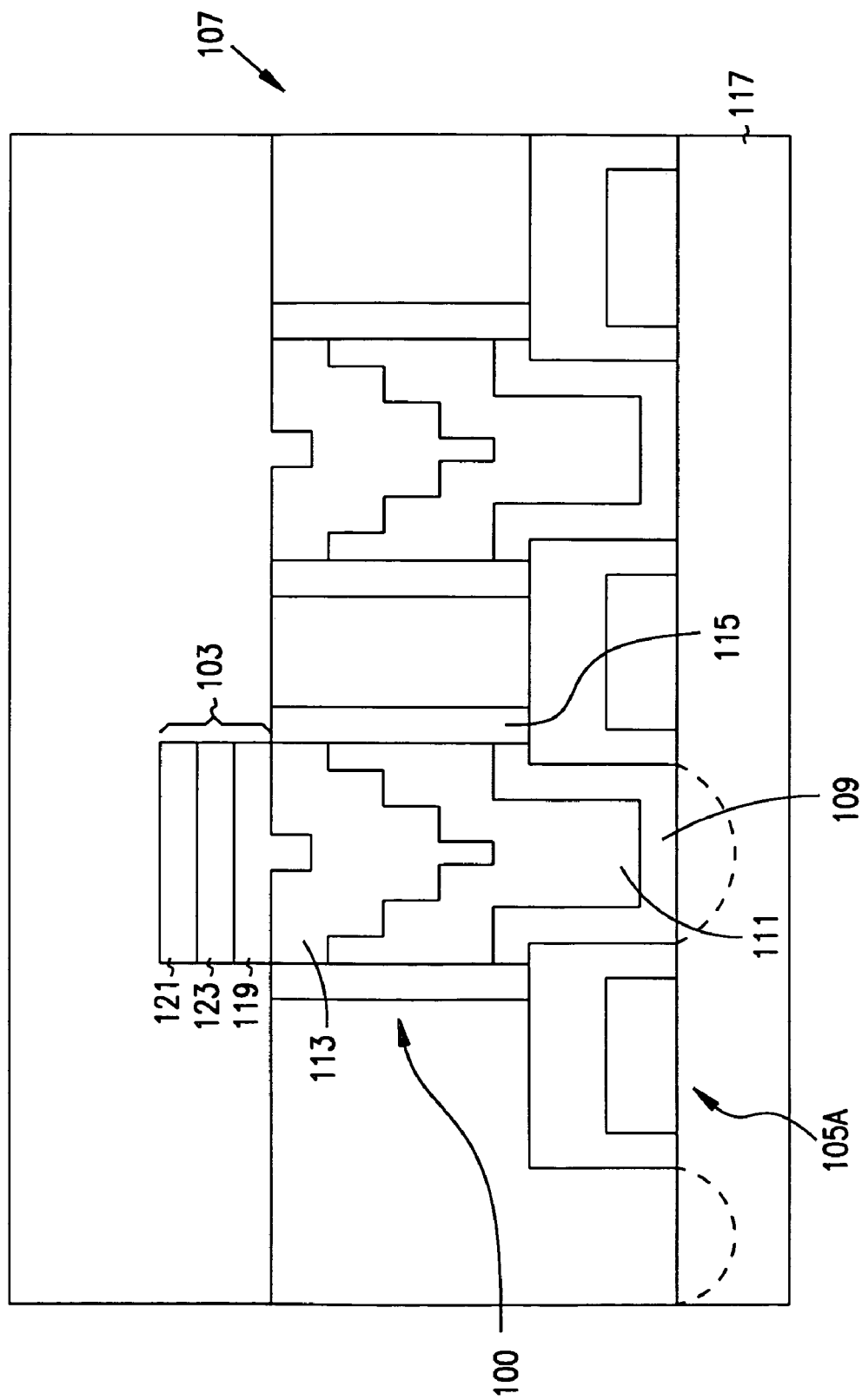

FIG. 1 is an illustration of one embodiment of contact structure 100 coupling device 103 to device 105 in integrated circuit 107. Contact structure 100 provides a conductive path for transmitting an electrical signal between devices 103 and 105. Contact structure 100, in one embodiment, includes polysilicon layer 109, barrier layers 111 and 113, and barrier structure 115. Devices 103 and 105, which are coupled together by contact structure 100, are not limited to a particular type of device. Devices 103 and 105 may be any type of active or passive device capable of being fabricated using integrated circuit technologies, such as metal-oxide semiconductor (MOS) or bipolar technologies. In the example embodiment shown in FIG. 1, device 103 is a capacitor and device 105 is a metal-oxide semiconductor field effect transistor (MOSFET). In the example embodiment shown in FIG. 1A, device 103 is a capacitor and device 105A is a bipolar transistor (BJT). However, contact structure 100 is not limited to use in connection with a particular type of integrated circuit 107. Contact structure 100 is suitable for use in connection with linear integrated circuits, such as operational amplifiers, digital integrated circuits, such as boolean logic circuits and storage circuits, and memory circuits, such as dynamic random access memory (DRAM) circuits, static random access memory (SRAM) circuits, erasable programmable read only memory (EPROM) circuits, electrically erasable programmable read only memory (EEPROM) circuits, and flash memory circuits.

A structure described herein encircles a second structure or layer when the structure partially or completely surrounds any portion of the second structure or layer. For example, in FIG. 1 barrier structure 115 encircles polysilicon layer 109 and barrier layers 111 and 113.

Figure 2:
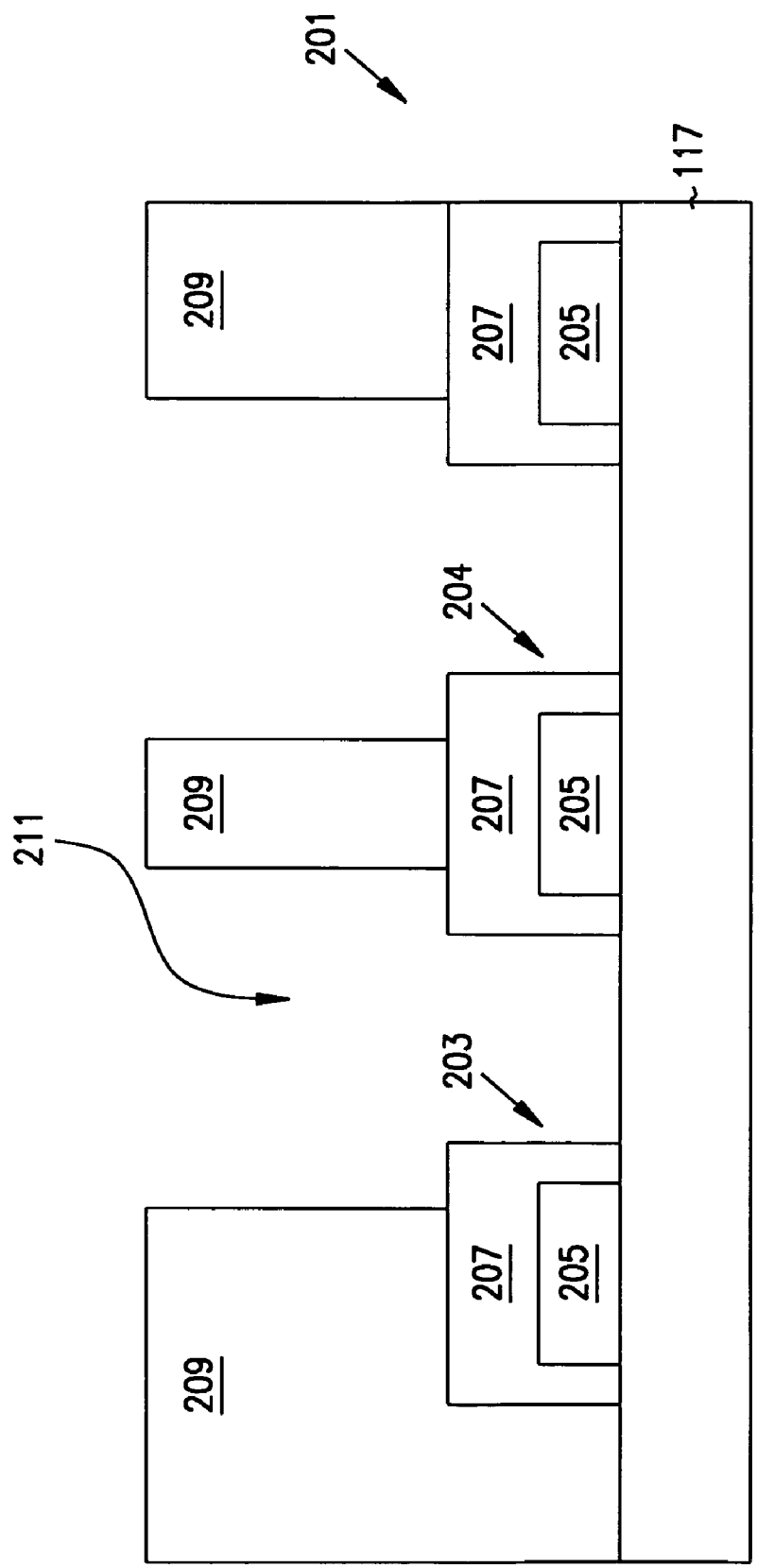
FIG. 2 is an illustration of a cross-sectional view of one embodiment of an integrated circuit structure suitable for use as a foundation for a contact structure.

FIGS. 2-7 illustrate a series of cross-sectional views of integrated circuit 107 during the fabrication of contact structure 100. FIG. 2 illustrates one embodiment of base structure 201 suitable for use as a foundation for the fabrication of contact structure 100. Base structure 201 includes substrate 117, circuit structures 203 and 204 including polysilicon layer 205 and silicon nitride layer 207, and borophosphosilicate glass (BPSG) layer 209. BPSG layer 209 is etched to form plug volume 211.

Substrate 117 is preferably fabricated from a material, such as a semiconductor, that is suitable for use as a substrate in connection with the fabrication of integrated circuits. Substrate 117 includes doped and undoped semiconductors, epitaxial semiconductor layers supported by a base semiconductor or insulator, as well as other semiconductor structures having an exposed surface with which to form the contact structures of the present invention. Substrate 117 refers to semiconductor structures during processing, and may include other layers that have been fabricated thereon. In one embodiment, substrate 117 is fabricated from silicon. Alternatively, substrate 117 is fabricated from germanium, gallium-arsenide, silicon-on-insulator, silicon-on-sapphire, or any other crystalline or amorphous material suitable for use as a substrate in the manufacture of integrated circuits. Substrate 117 is not limited to a particular material, and the material chosen for the fabrication of substrate 117 is not critical to the practice of the present invention.

Figure 3:
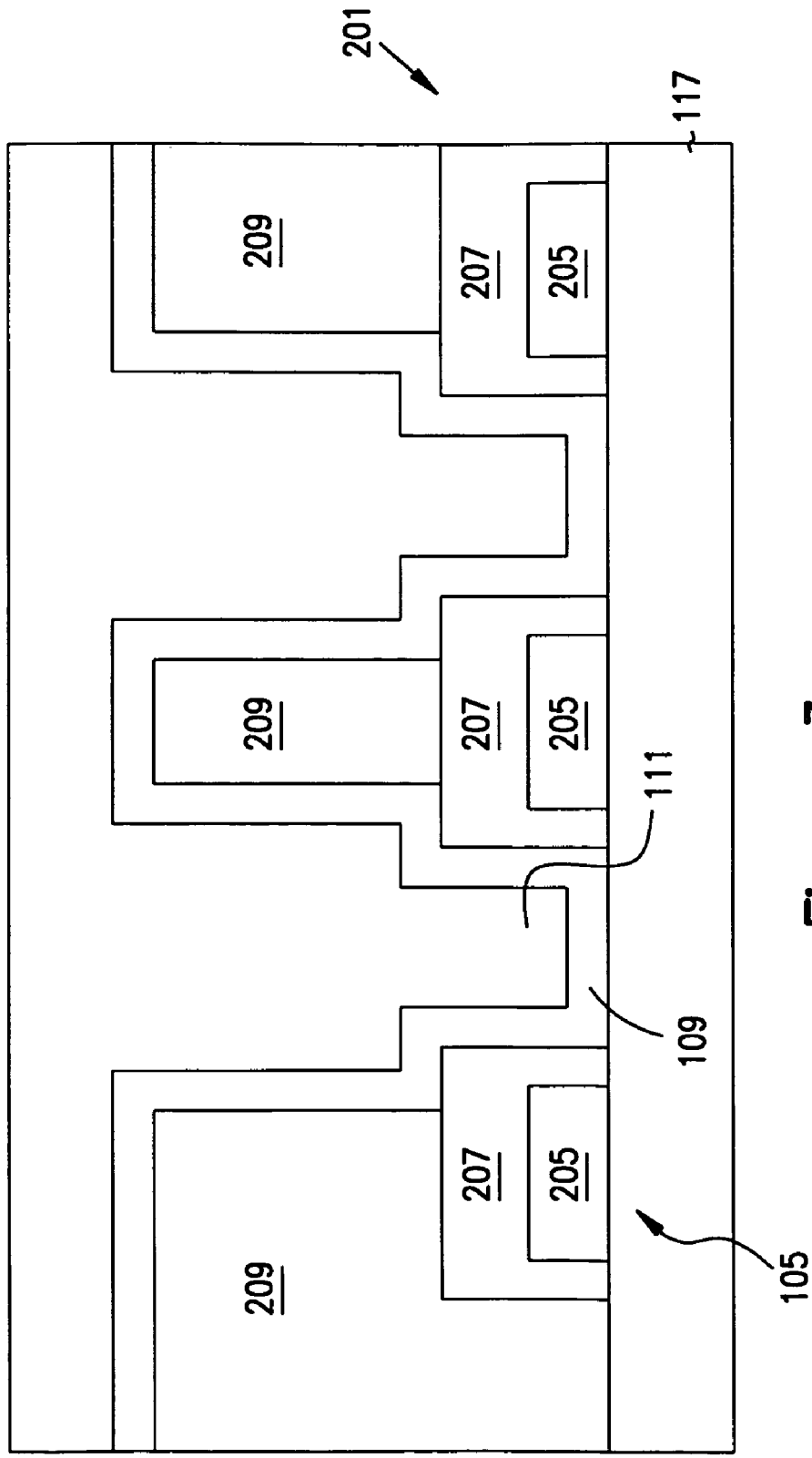
FIG. 3 is an illustration of a cross-sectional view of one embodiment of a partially formed contact structure.

FIG. 3 is an illustration of a cross-sectional view of one embodiment of a partially formed contact structure 100 including polysilicon layer 109 and barrier layer 111. Polysilicon layer 109 is deposited above base structure 201 to a thickness of between about 450 angstroms and 550 angstroms. The thickness of polysilicon layer 109 is not critical to the performance of the present invention, and the thickness of polysilicon layer 109 may be varied to meet the design rules of a particular integrated circuit fabrication process. After polysilicon layer 109 is deposited, barrier layer 111 is deposited above polysilicon layer 109. Barrier layer 111 prevents the diffusion of substrate atoms beyond barrier layer 111 and provides a conductive path between device 103 and device 105, as shown in FIG. 1. In one embodiment, barrier layer 111 is fabricated from tungsten nitride and has a thickness of between about 900 angstroms and 1100 angstroms. A thickness of less than about 900 angstroms does not sufficiently block the etch during the removal of the encircling polysilicon. A thickness of more than about 1100 angstroms causes contact structure 100 to have very little space remaining for the ruthenium silicide. During the formation of barrier layer 111, voids may form in the layer. Although it is preferable to avoid the formation of voids in barrier layer 111, the operation of contact structure 100 is not significantly degraded by the formation of voids.

Figure 4:
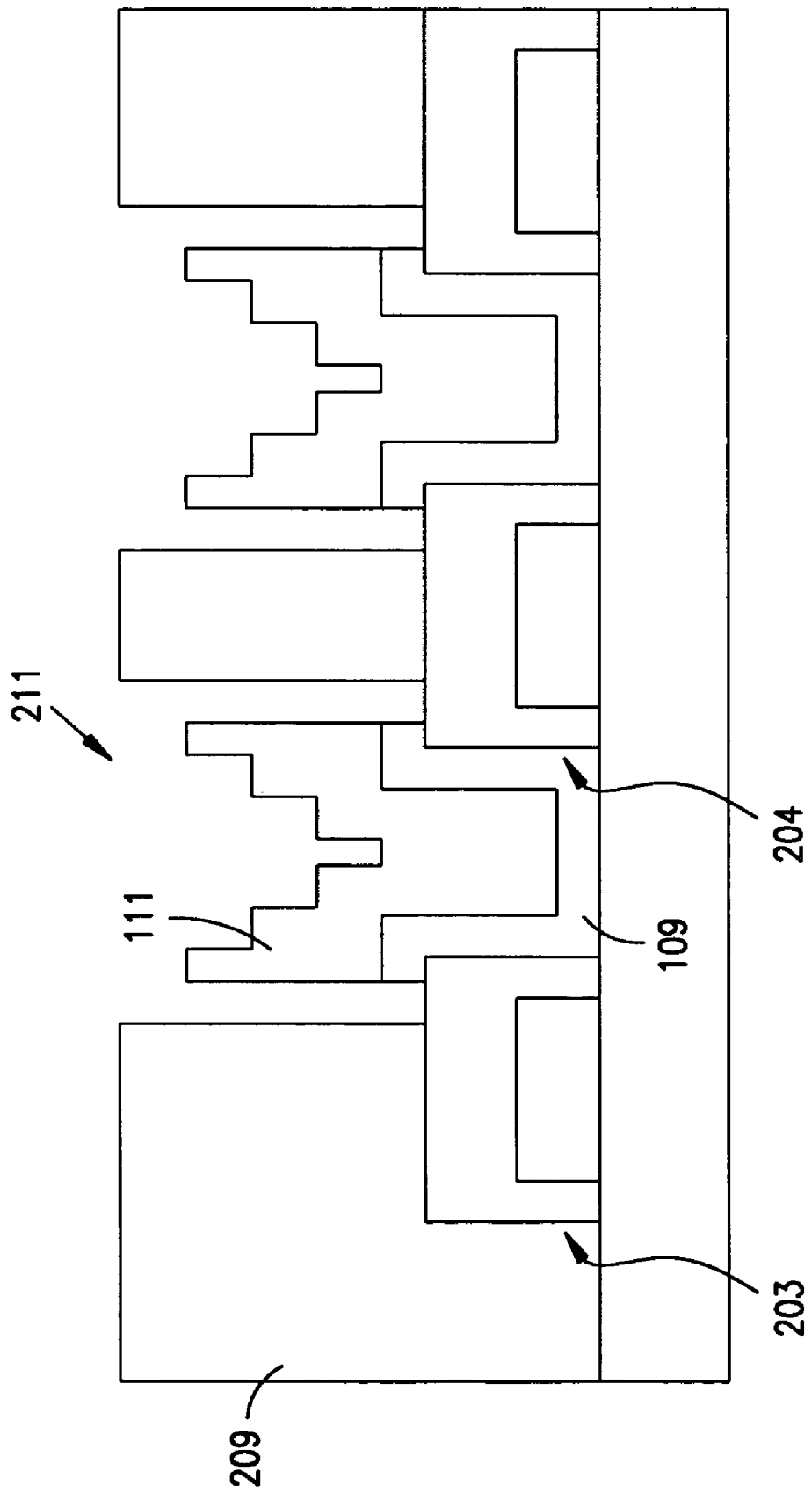
FIG. 4 is an illustration of a cross-sectional view of one embodiment of the partially formed contact structure of FIG. 3 after etching.

FIG. 4 is an illustration of a cross-sectional view of one embodiment of the partially formed contact structure, which is shown in FIG. 3, after etching. Barrier layer 111 and polysilicon layer 109 are etched to a level below the surface of the BPSG layer 209. Polysilicon layer 109 is preferably etched long enough to recess the outer perimeter of the plug volume 211 down to circuit structures 203 and 204.

Figure 5:
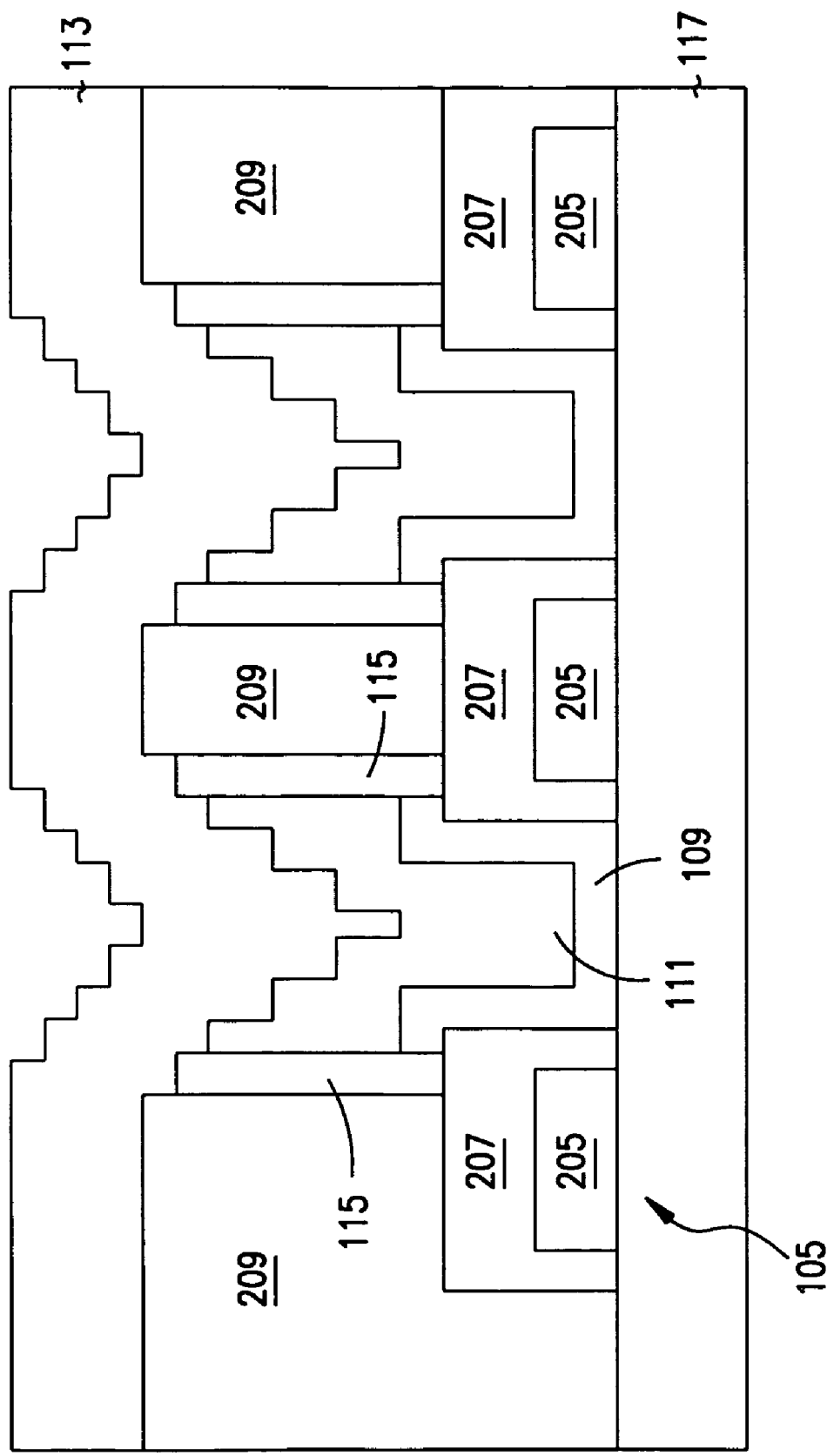
FIG. 5 is an illustration of a cross-sectional view of one embodiment of the partially formed contact structure of FIG. 4 after the formation of a barrier structure and a second barrier layer.

FIG. 5 is an illustration of one embodiment of the partially formed contact structure shown in FIG. 4 after the formation of barrier structure 115 and barrier layer 113. Barrier structure 115 prevents polysilicon layer 109 from interacting with barrier layer 113. In one embodiment, barrier structure 115 is fabricated by forming a layer of silicon nitride above substrate 117 and etching the silicon nitride to a level below the surface of BPSG layer 209. Barrier structure 115 has a thickness that is about equal to the thickness of polysilicon layer 109. After barrier structure 115 is fabricated, barrier layer 113 is fabricated above barrier layer 111 and barrier structure 115. Barrier layer 113 prevents oxygen from diffusing into substrate 117 and provides a conductive path between device 103 and device 105, as shown in FIG. 1. In one embodiment, barrier layer 113 is fabricated by forming a layer of platinum-iridium (PtIr) above barrier layer 111 and barrier structure 115. In an alternate embodiment, barrier layer 113 is fabricated by forming a layer of platinum-rhodium (PtRh) above barrier layer 111 and barrier structure 115.

Figure 6:
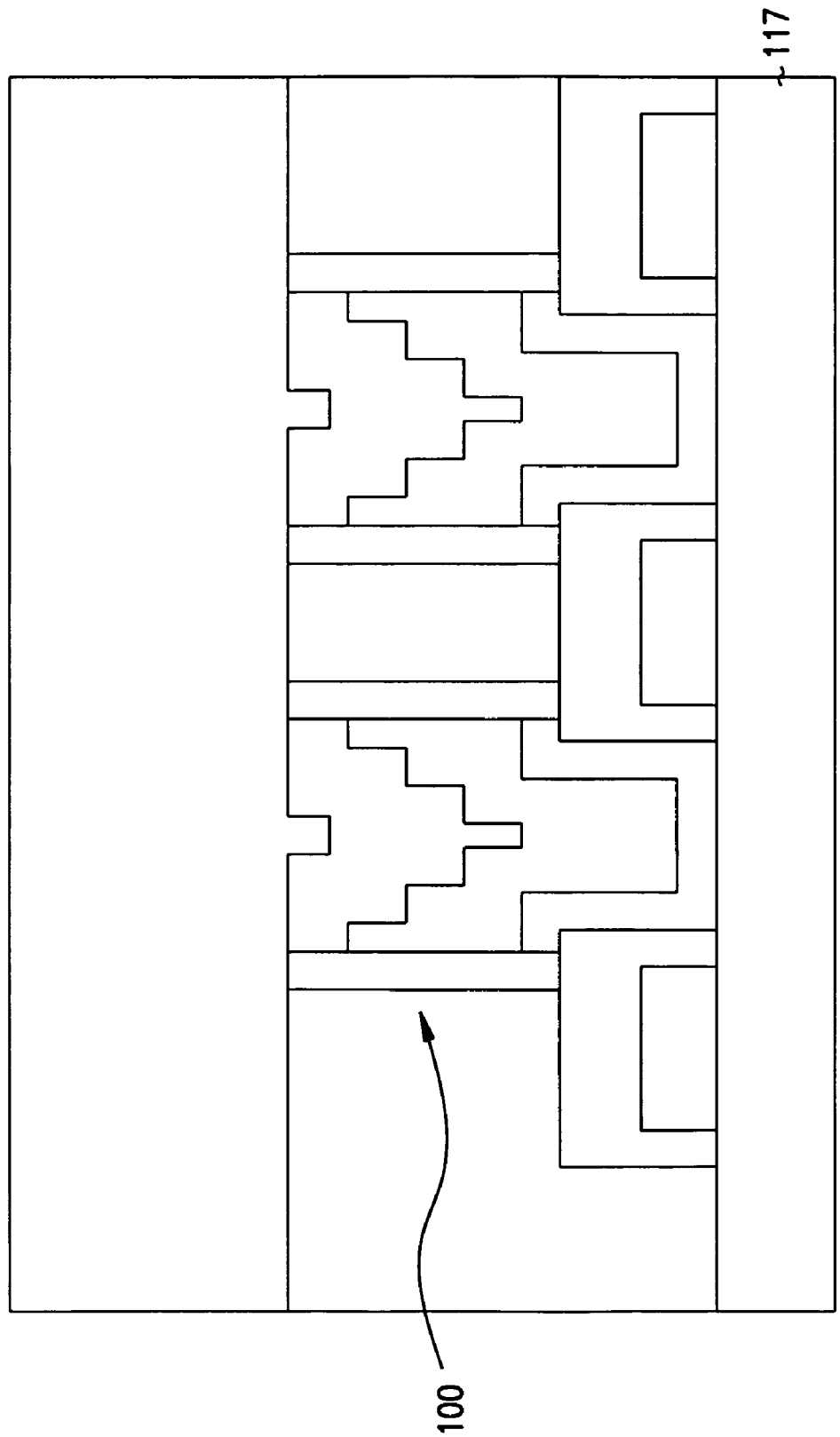
FIG. 6 is an illustration of a cross-sectional view of one embodiment of the contact structure of FIG. 5 after cleaning and polishing.

FIG. 6 is an illustration of one embodiment of the contact structure shown in FIG. 5 after cleaning and polishing. A chemical-mechanical polishing (CMP) process and a post CMP process is applied contact structure 100 and to the surface of substrate 117. The post CMP process is either a wet or sputter etch for removing CMP residue and smeared barrier material. After the post CMP process, device 103, as shown in FIG. 1, may be fabricated above contact structure 100. In one embodiment, device 103 is a capacitor having a pair or electrodes 119 and 121 and a dielectric 123 for storing charged sensed by device 105.

Referring again to FIG. 1, in operation, contact structure 100 provides a conductive path for the exchange of electronic signals between devices 103 and 105. For example, in a DRAM cell in which device 103 is a capacitor and device 105 is a MOSFET, contact structure 100 provides a path so that the MOSFET is capable of sensing charge stored on the capacitor. Contact structure 100 also provides a barrier layer 111 for blocking the migration of substrate atoms into the upper layers of integrated circuit 107. In addition, contact structure 100 provides barrier layer 113 for blocking the migration of oxygen atoms into substrate 117.

Figure 7:
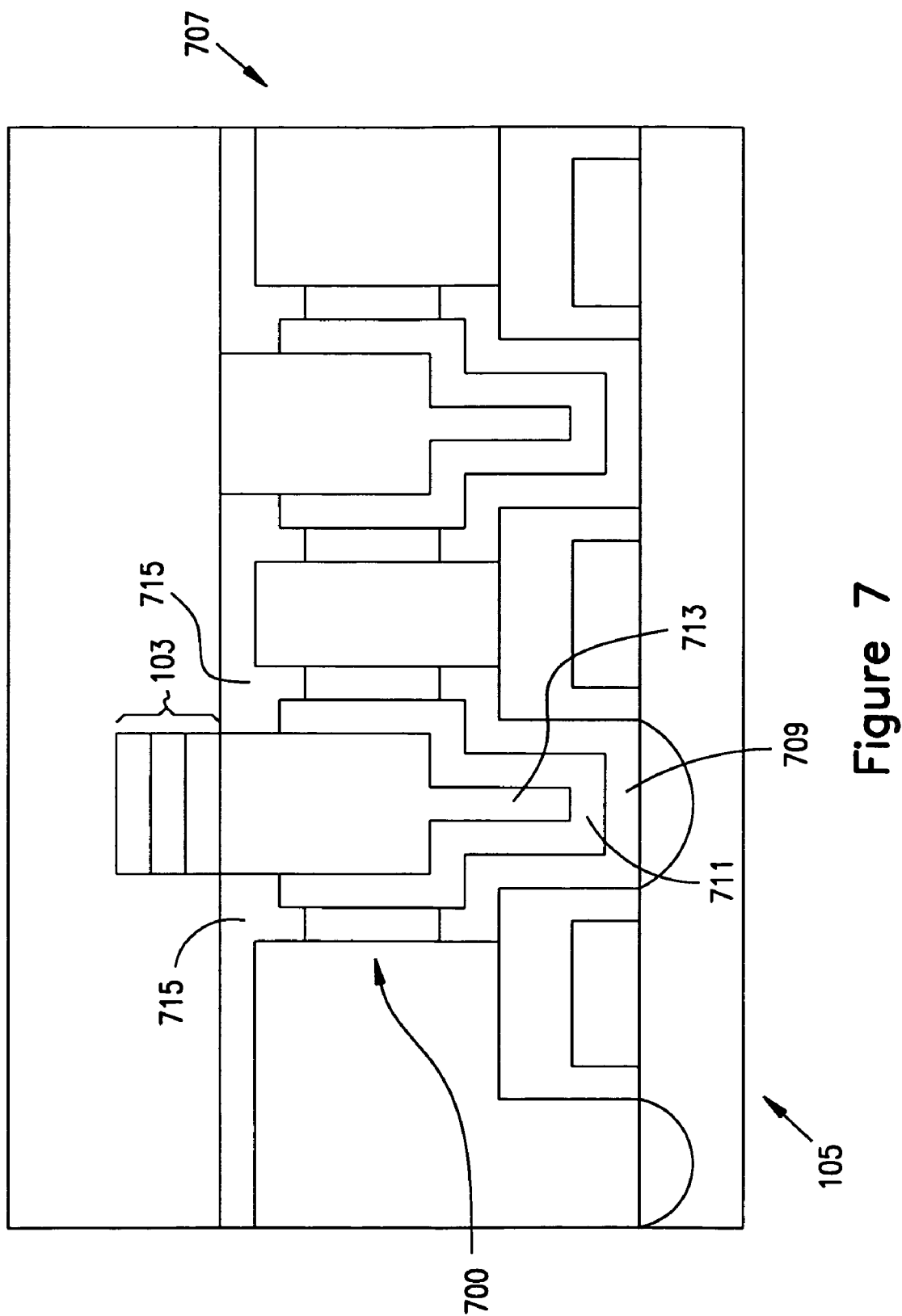
FIG. 7 is an illustration of a cross-sectional view of an alternate embodiment of a contact structure.

FIG. 7 is an illustration of a cross-sectional view of an alternate embodiment of a contact structure. Contact structure 700 couples device 103 to device 105 in integrated circuit 707. Contact structure 700 provides a conductive path for transmitting an electrical signal between devices 103 and 105. Contact structure 700, in one embodiment, includes polysilicon layer 709, barrier layers 711 and 713, and barrier structure 715. Devices 103 and 105, which are coupled together by contact structure 700, are not limited to a particular type of device. Devices 103 and 105 may be any type of active or passive device capable of being fabricated using integrated circuit technologies, such as metal-oxide semiconductor (MOS) or bipolar technologies. In the example embodiment shown in FIG. 7, device 103 is a capacitor and device 105 is a metal-oxide semiconductor field effect transistor (MOSFET). However, contact structure 700 is not limited to use in connection with a particular type of integrated circuit 707. Contact structure 700 is suitable for use in connection with linear integrated circuits, such as operational amplifiers, digital integrated circuits, such as boolean logic circuits and storage circuits, and memory circuits, such as dynamic random access memory (DRAM) circuits, static random access memory (SRAM) circuits, electrically programmable memory (EPROM) circuits, and electrically erasable programmable memory (EEPROM) circuits.

Figure 8:
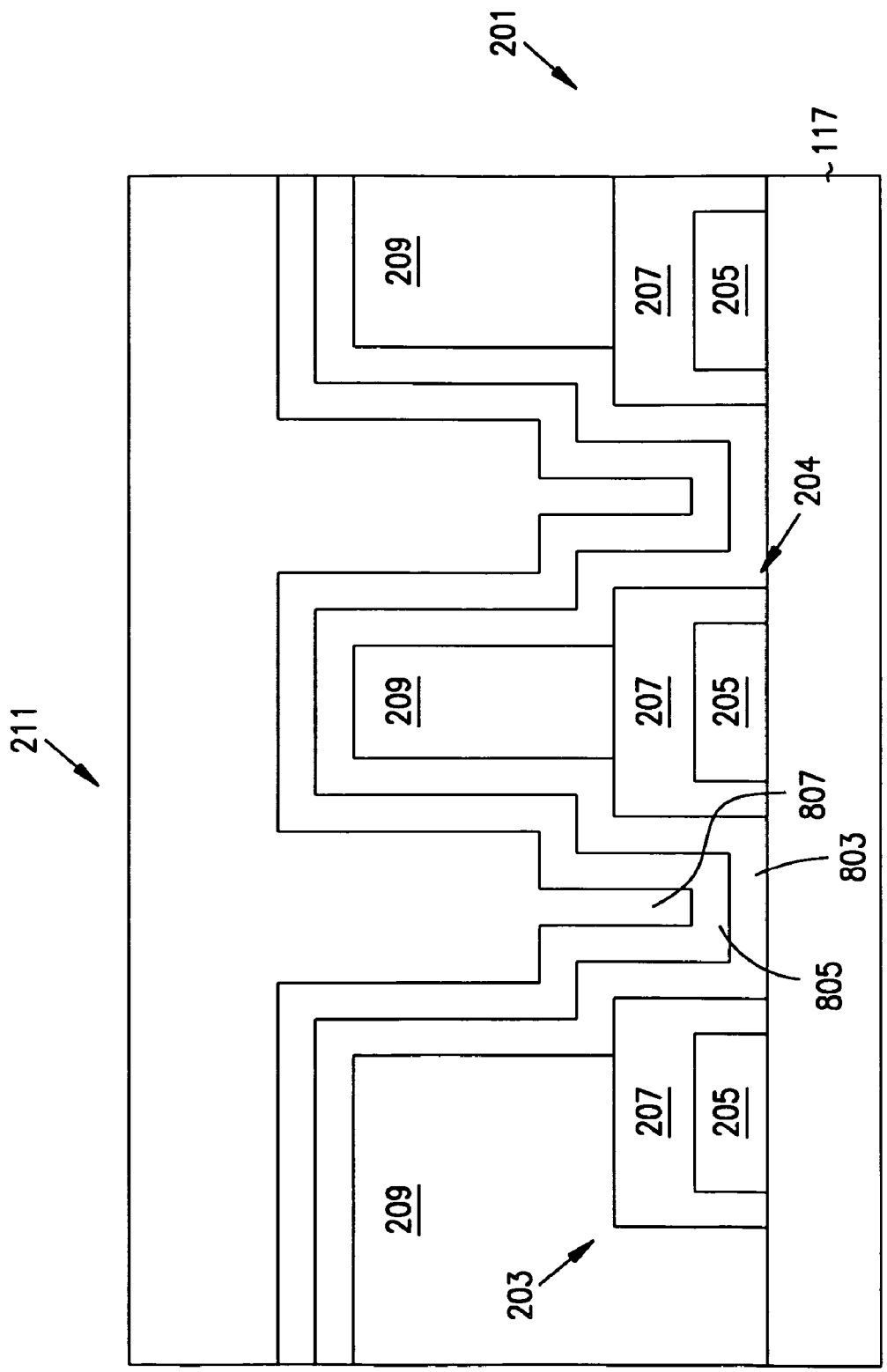
FIG. 8 is an illustration of a cross-sectional view of one embodiment of a partially formed contact structure.

FIG. 8 is an illustration of a cross-sectional view of one embodiment of a partially formed contact structure of FIG. 7 after the fabrication of one or more layers. The embodiment illustrated in FIG. 8 incldes base structure 201 including substrate 117, circuit structures 203 and 204, which include polysilicon layer 205 and silicon nitride layer 207, and borophosphosilicate glass (BPSG) layer 209, which are described above in connection with contact structure 100. Also, as described above in connection with contact structure 100, BPSG layer 209 is etched to form plug volume 211. After the formation of plug volume 211, polysilicon layer 803, tungsten nitride layer 805, and RuSix layer 807 are formed above substrate 117. In one embodiment, the thickness of polysilicon layer 803 is about 500 angstroms, the thickness of tungsten nitride layer 805 is about 500 angstroms, and the thickness of RuSix layer 807 is about 2000 angstroms.

Figure 9:
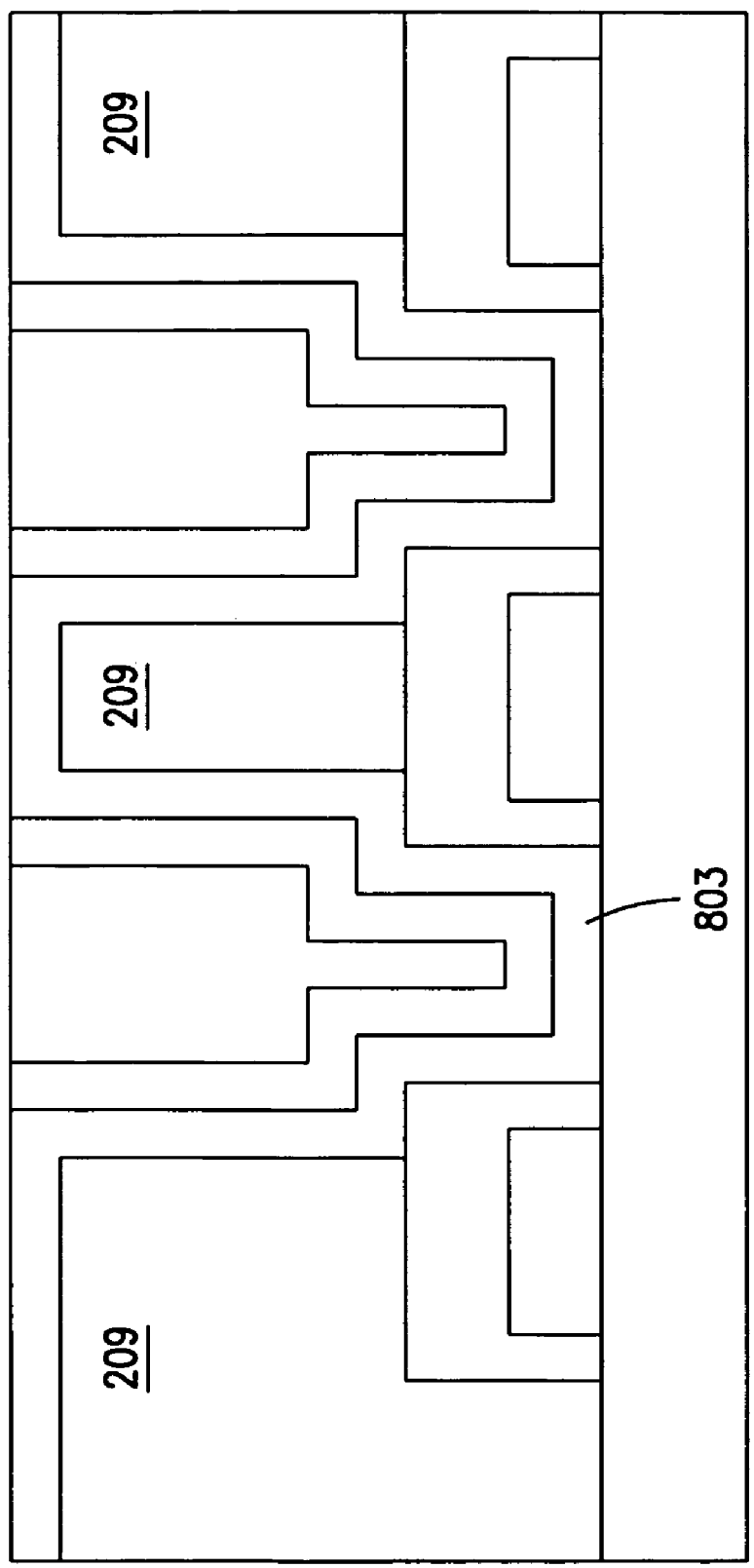
FIG. 9 is an illustration of a cross-sectional view of one embodiment of the partially formed contact structure of FIG. 8 after chemical mechanical polishing (CMP).

FIG. 9 is an illustration of a cross-sectional view of one embodiment of the partially formed contact structure of FIG. 8 after chemical mechanical polishing (CMP). In performing the CMP it is not necessary to completely remove polysilicon layer 803 from the surface of the BPSG layer 209. The CMP is followed by a dry etch to remove polysilicon layer 803 and tungsten nitride layer 805.

Figure 10:
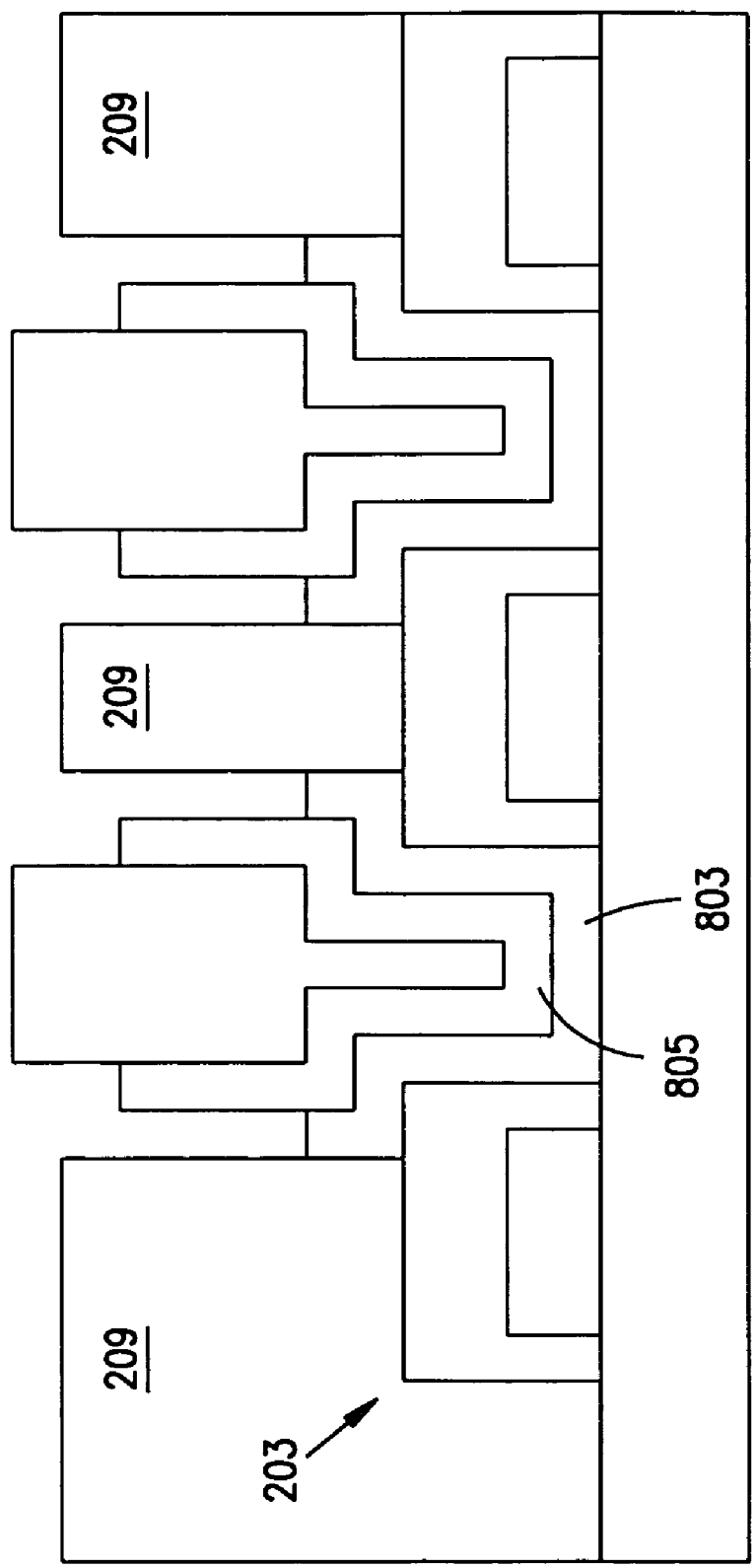
FIG. 10 is an illustration of a cross-sectional view of one embodiment of the partially formed contact of FIG. 9 after etching.

FIG. 10 is an illustration of a cross-sectional view of one embodiment of the partially formed contact of FIG. 9 after etching. A dry etch removes polysilicon layer 803 from the surface of BPSG 209, and etches polysilicon layer 803 and tungsten nitride layer 805 to a level below the surface of the BPSG layer 209. A dry etch of polysilicon layer 803 removes the polysilicon layer to a level near the surface of circuit structure 203. The dry etch also etches tungsten nitride layer 805 to a level below the surface of BPSG layer 209. Preferably, polysilicon layer 803 is etched to a level below the level of tungsten nitride layer 805.

Figure 11:
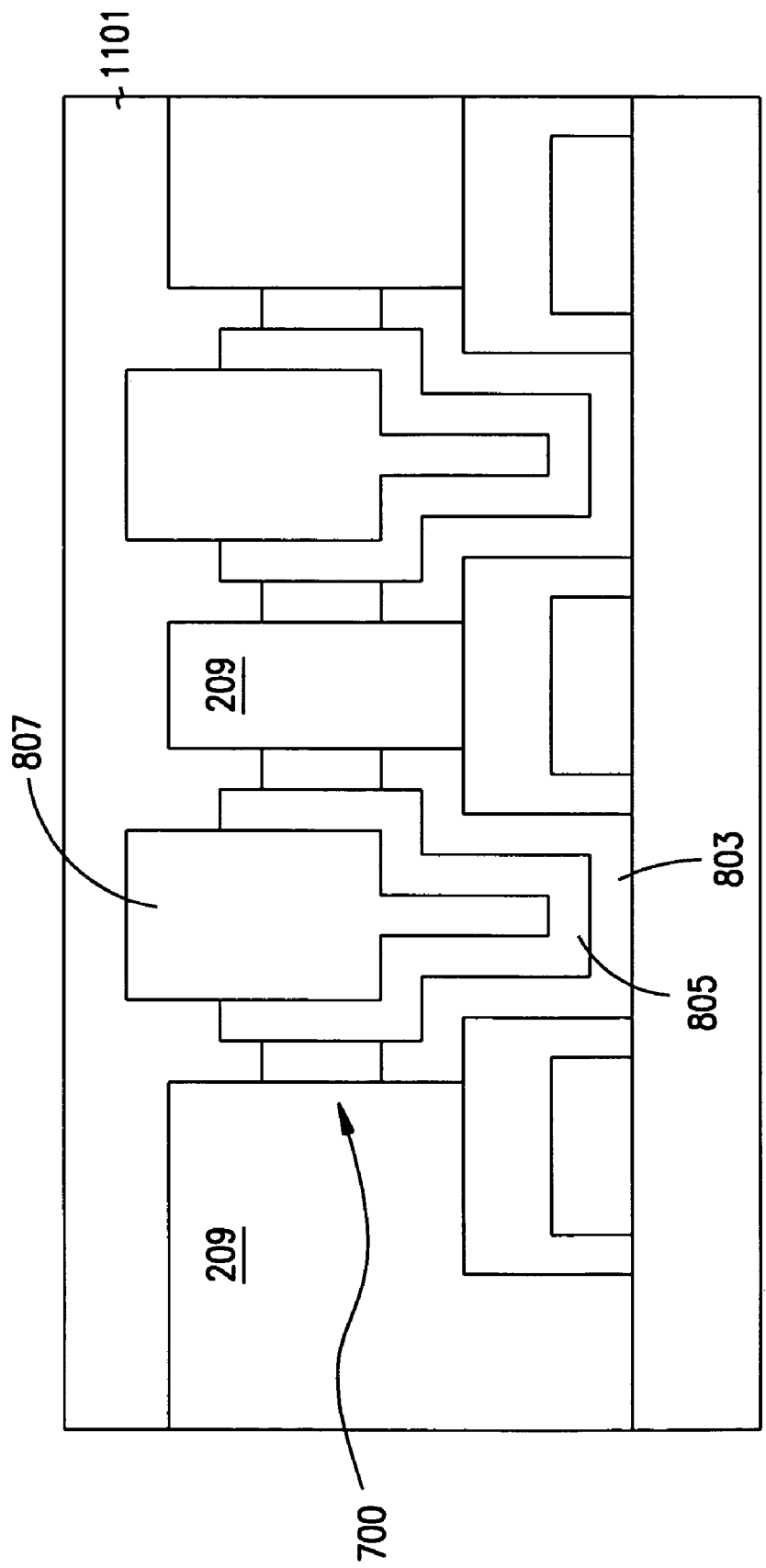
FIG. 11 is an illustration of a cross-sectional view of one embodiment of the partially formed contact of FIG. 10 after depositing an oxide layer.

FIG. 11 is an illustration of a cross-sectional view of one embodiment of the partially formed contact of FIG. 10 after forming oxide layer 1101. After contact structure 700 is etched as shown in FIG. 10, oxide layer 1101 is formed above contact structure 700 and at least partially fills the gap formed between tungsten nitride layer 805 and BPSG layer 209. Since oxide layer 1101 is intended to isolate polysilicon layer 803 from RuSix layer 807, oxide layer 1101 need not fill the gap down to the level of polysilicon layer 803.

Figure 12:
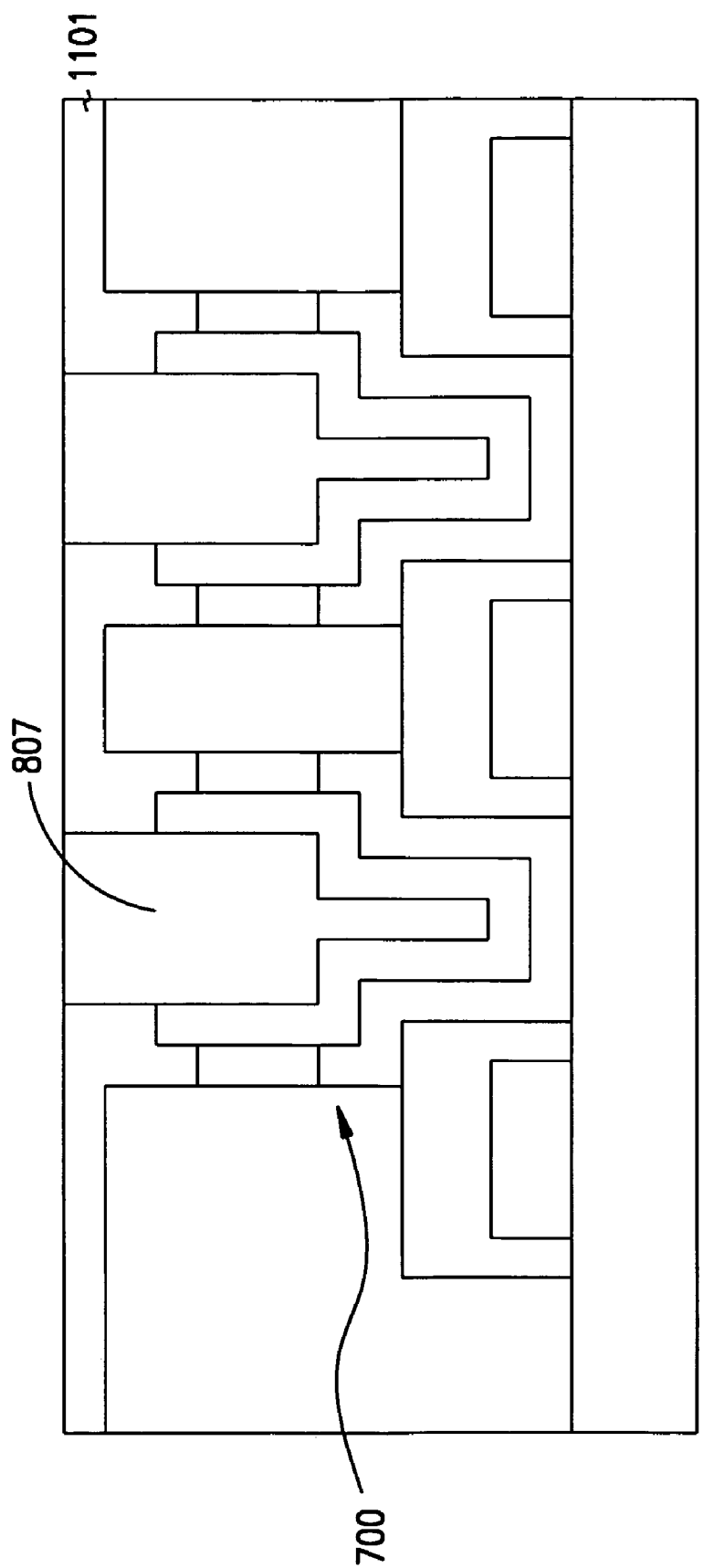
FIG. 12 is an illustration of a cross-sectional view of one embodiment of the partially formed contact structure of FIG. 11 after etching the oxide layer.

FIG. 12 is an illustration of a cross-sectional view of one embodiment of contact structure 700 of FIG. 11 after etching oxide layer 1101. Oxide layer 1001 is etched to expose RuSix layer 807. After exposing RuSix layer 807, contact structure 700 is capable of coupling device 103 to device 105, as illustrated in FIG. 7.

Figure 13:
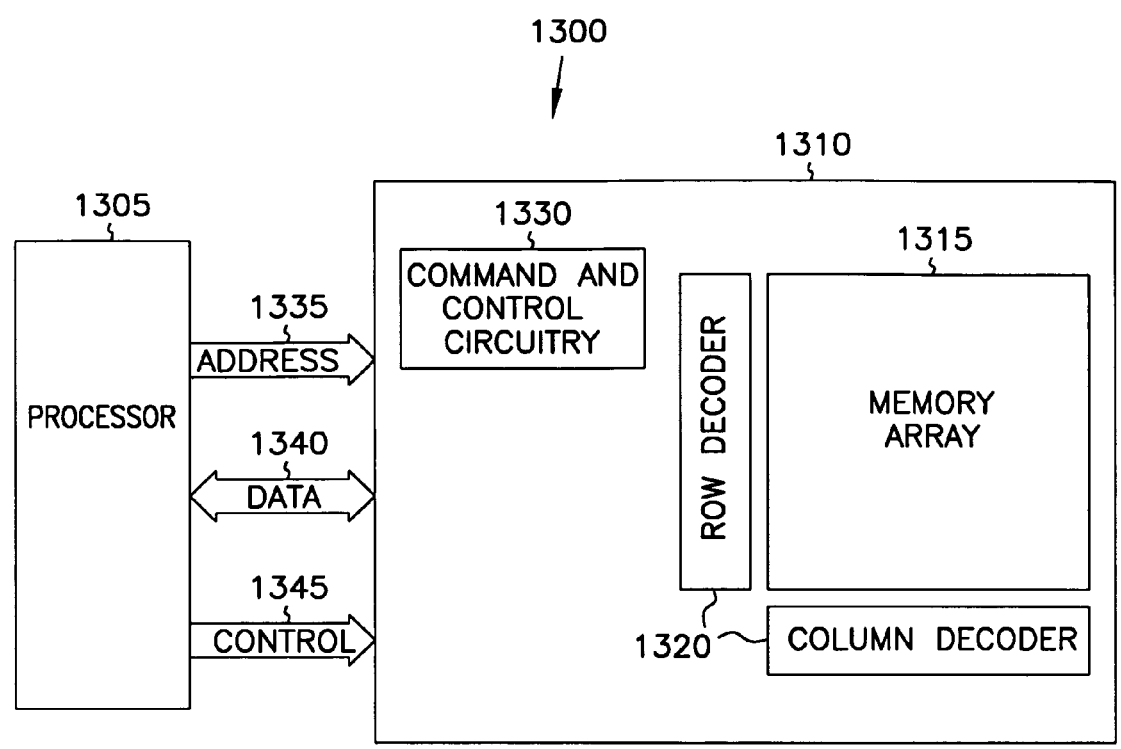
FIG. 13 a block diagram of a computer system suitable for use in connection with the present invention.

FIG. 13 a block diagram of a computer system suitable for use in connection with the present invention. System 1300 comprises processor 1305 and memory device 1310, which includes contact structures of one or more of the types described above in conjunction with FIGS. 1-12. Memory device 1310 comprises memory array 1315, address circuitry 1320, and read circuitry 1330, and is coupled to processor 1305 by address bus 1335, data bus 1340, and control bus 1345. Processor 1305, through address bus 1335, data bus 1340, and control bus 1345 communicates with memory device 1310. In a read operation initiated by processor 1305, address information, data information, and control information are provided to memory device 1310 through busses 1335, 1340, and 1345. This information is decoded by addressing circuitry 1320, including a row decoder and a column decoder, and read circuitry 1330. Successful completion of the read operation results in information from memory array 1315 being communicated to processor 1305 over data bus 1340.

CONCLUSION

Contact structures and methods of fabricating contact structures have been described. The contact structures include one or more barrier layers and a barrier structure. One of the barrier layers is capable of blocking the migration of substrate atoms. Another of the barrier layers is capable blocking the migration of oxygen atoms. The barrier structure prevents at least two layers in the contact structure from reacting with each other. The methods of fabricating the contact structure include processes for forming the layers of the contact structure, etching the layers of the contact structure, forming the barrier structure, and polishing the contact structure.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method of forming an integrated circuit, the method comprising:
   forming a first device;
   forming a second device;
   forming first and second layers coupling the first device to the second device, wherein the first layer blocks oxygen atom migration and the second layer substrate atom migration, and wherein the first layer is fabricated on top of the second layer, and wherein the second layer is formed on top of a polysilicon layer; and
   forming a structure encircling the first and second layers and the polysilicon layer on two opposing sides of the first and second layers, wherein the first and second layers are electrically conductive, and wherein the structure prevents the polysilicon layer from interacting with the first layer.

2. The method of claim 1 wherein in forming the first device further includes forming the first device as a capacitor.

3. The method of claim 1 wherein in forming the second device further includes forming the second device as a MOSFET.

4. A method of forming an integrated circuit, the method comprising:
   forming a first device;
   forming a second device;
   forming one or more layers coupling the first device to the second device, wherein at least one of the one or more layers includes platinum-iridium, which restricts oxygen atom migration, and at least one of the one or more layers restricts substrate atom migration, and wherein the one or more layers are fabricated on top of one another, and wherein the layers that restrict atom migration are formed on top of a polysilicon layer; and
   forming a structure that encircles the one or more layers and the polysilicon layer on two opposing sides of the one or more layers, wherein the one or more layers are electrically conductive, and wherein the structure prevents the polysilicon layer from interacting with the layers that restrict oxygen atom migration.

5. The method of claim 4 wherein forming the one or more layers further includes forming a layer of tungsten nitride having a thickness of between about 900 angstroms and 1100 angstroms.

6. The method of claim 4 wherein forming the second device further includes forming the second device as a bipolar transistor.

7. A method, comprising:
   forming first and second layers that couple a first device to a second device, the first and second layers restrict oxygen atom and substrate atom migration, and wherein the first layer is fabricated on top of the second layer, and wherein the second layer is fabricated on top of a polysilicon layer; and
   forming a structure to encircle the first and second layers and the polysilicon layer on two opposing sides of the layers, wherein the first and second layers are electrically conductive, and wherein the structure prevents the polysilicon layer from interacting with the first layer.

8. The method of claim 7 further includes forming the first and second devices.

9. The method of claim 8 wherein forming the first and second devices further includes forming the first device as a capacitor and forming the second device as a MOSFET.

10. A method, comprising:
    forming a first device as an active device and a second device as a passive device;
    forming a first layer that restricts oxygen atom migration;
    forming a second layer that restricts substrate atom migration, wherein the first layer is fabricated on top of the second layer, and wherein the second layer is formed on top of a polysilicon layer;
    coupling the first and second devices with the first and second layers, wherein the first and second layers are electrically conductive; and
    encircling the first and second layers and the polysilicon layer with a structure on two opposing sides of the first and second layers and the polysilicon layer and the structure prevents the polysilicon layer from interacting with the first layer.

11. The method of claim 10 wherein forming the first layer further includes forming the first layer with platinum-iridium.

12. The method of claim 10 wherein encircling further includes forming the structure as a silicon nitride structure.

13. The method of claim 10 wherein forming the second layer further includes forming the second layer as a tungsten nitride layer.

14. The method of claim 10 wherein forming the first layer further includes forming a layer of platinum-iridium above the second layer.

* * * * *